US006884587B2

(12) United States Patent
Ford et al.

(10) Patent No.: US 6,884,587 B2
(45) Date of Patent: Apr. 26, 2005

(54) METALLIZATION OF NUCLEIC ACIDS VIA METAL NANOPARTICLES PRODUCED EX-SITU

(75) Inventors: William E. Ford, Stuttgart (DE); Jurina Wessels, Stuttgart (DE); Oliver Harnack, Stuttgart (DE); Akio Yasuda, Stuttgart (DE)

(73) Assignee: Sony International (Europe) GmbH, Berlin (DE)

( * ) Notice: Subject to any disclaimer, the term of this patent is extended or adjusted under 35 U.S.C. 154(b) by 21 days.

(21) Appl. No.: 10/210,812

(22) Filed: Aug. 1, 2002

(65) Prior Publication Data

US 2003/0027195 A1 Feb. 6, 2003

(30) Foreign Application Priority Data

Aug. 3, 2001 (EP) .............................................. 01118920

(51) Int. Cl.⁷ .......................... C12Q 1/68; A01N 43/04; A61K 31/70; C07H 21/02; C07H 21/04
(52) U.S. Cl. .............................. 435/6; 514/44; 536/23.1
(58) Field of Search ............................... 435/6; 514/44; 536/23.1

(56) References Cited

FOREIGN PATENT DOCUMENTS

WO WO 97 48837 12/1997
WO WO 99 04440 1/1999

OTHER PUBLICATIONS

Harker, C.S.W. et al., "Studies on the interaction of gold(i) phosphines with 2–thiouracil. Related studies with silver(i) phosphines", Inorg. Chim. Acta, vol. 181, pp. 23–30 (1991).*

Mbindyo J K N et al: "DNA–Directed Assembly of Gold Nanowires on Complementary Surfaces" Advanced Materials, VCH Verlagsgesellschaft, Weinheim, DE, vol. 13, No. 4, Feb. 19, 2001, pp. 249–254, XP001004980.

Mirkin C A et al: "A DNA–Based Method for Rationally Assembling Nanoparticles Into Macroscopic Materials" Nature, vol. 382, Aug. 15, 1996, pp. 607–609, XP002186730.

Richter J et al: "Nanoscale Palladium Metallization of DNA" Advanced Materials, VCH Verlagsgesellschaft, Weinheim, DE, vol. 12, No. 7, Apr. 4, 2000, pp. 507–510, XP000949756.

Braun E et al: "DNA–Templated Assembly and Electrode Attachment of a Conducting Silver Wire" Nature, Macmillan Magazines, US, vol. 6669, No. 391, pp. 775–778, XP002079216.

Berning D E et al: "Au–Labeled Hydroxymethyl Phosphines as Models for Potential Therapeutic Pharmaceuticals–Production and Decay Property Considerations" Nuclear Medicine and Biology, Elsevier Science Publishers, New York, NY, US, vol. 25, No. 6, Aug. 1, 1998, pp. 577–583, XP004133349.

* cited by examiner

*Primary Examiner*—Jeffrey Fredman
*Assistant Examiner*—Teresa Strzelecka
(74) *Attorney, Agent, or Firm*—Frommer Lawrence & Haug LLP; William S. Frommer

(57) ABSTRACT

The invention relates to a process for the metallization of nucleic acids, comprising providing tris(hydroxymethyl) phosphine-Au (THP-Au) particles or derivatives thereof, binding said THP-Au particles to a nucleic acid to produce a metal nanoparticle-nucleic acid composite, and treatment of the metal nanoparticle-nucleic acid composite with an electroless plating solution. The invention further relates to a metallized nucleic acid obtainable according to such a method and a nanowire including a method for the manufacture of a nanowire.

32 Claims, 3 Drawing Sheets

METALLIZATION OF NUCLEIC ACIDS VIA METAL NANOPARTICLES PRODUCED EX-SITU

FIELD OF THE INVENTION

The present invention is related to a process for the metallisation of nucleic acids using pre-formed metal nanoparticles that bind spontaneously to nucleic acids. The attached particles are then enlarged via electroless deposition. The particles and the metallised nucleic acids can be used in the formation of nanowires, for electronic networks and circuits allowing a high density arrangement. An additional application is possible using the single electron charging properties of the isolated nucleic acids templated nanoparticles for e.g. memory devices.

BACKGROUND OF THE INVENTION

The electronic industry shows a constant effort in obtaining high density wiring and circuits. One key issue in reaching this goal is to make the individual wires as small as possible. One approach known in the prior art is the metallisation of nucleic acids which, once metallised, serves as an electrically conducting wire.

In addition, the "metalation" of nucleic acids is known, which refers to the process of direct bonding between a metal atom and a site within the nucleic acid, especially to the N-7 atoms of the purine nucleotides (G and A). Such reactions have been widely studied because of their relevance to the mechanisms of anti-cancer drugs, mostly Pt (II) or Pt (IV) complexes ("platination"). Other metal complexes exhibiting this behavior include the complexes of Pd, Ru, Au, Rh. The complex requires at least one "labile" ligand as a "leaving group" in order to bind in this manner.

Further, nucleic acid binding agents have been widely studied as anti-cancer drugs. Non-covalent binding agents include "intercalators" and "groove binders". Agents that bind covalently are generally called "alkylators". Many examples of each class of agents are known, as well as molecules with combined functions. Selectivity towards specific base pair combinations or sequences or other "recognition sites" is tuneable to a high degree (e.g. "drug targeting").

WO 99/04440, published on Jan. 28, 1999, describes a three-step process for the metallisation of DNA. First, silver ions ($Ag^+$) are localized along the DNA through $Ag^+/Na^+$ ion-exchange and formation of complexes between the $Ag^+$ and the DNA nucleotide bases. The silver ion/DNA complex is then reduced using a basic hydroquinone solution to form silver nanoparticles bound to the DNA skeleton. The silver nanoparticles are subsequently "developed" using an acidic solution of hydroquinone and $Ag^+$ under low light conditions, similar to the standard photographic procedure. This process produces silver wires with a width of about 100 nm with differential resistance of about 10 M$\Omega$.

Further, Pompe et al. (Pompe et al. (1999) Z. Metallkd. 90, 1085; Richter et al. (2000) Adv. Mater. 12, 507) describe DNA as a template for metallisation in order to produce metallic nanowires. Their metallisation method involves treating DNA with an aqueous solution of $Pd(CH_3COO)_2$ for 2 hours, then adding a solution of dimethylamine borane (DMAB) as reducing agent. Palladium nanoparticles with a diameter of 3–5 nm grow on the DNA within a few seconds of the reducing agent being added. After about 1 minute, quasi-continuous coverage is achieved, with metallic aggregates being 20 nm in size.

There are two recent publications in which positively charged gold nanoparticles were attached to DNA via electrostatic assembly [Kumar et al. (2001) Advanced Materials, Vol. 13, p. 341; Sastry et al. (2001) Applied Physics Letters, Vol. 78, p. 2943]. Those papers do not discuss enlarging the attached particles via electroless plating. Richter et al. have published an article on DNA metallisation [Richter et al. (2001) Applied Physic Letters, Vol. 78, p. 536]. Also noticed was an article in which DNA was metallised by evaporation of gold [Quake and Scherer (2000) Science, Vol. 290, p. 1536] and one in which DNA was used to assemble pre-formed gold nanowires [Mbindyo et al. (2001) Advanced Materials, Vol. 13, p. 249]. None of the publications mentioned above appear to have direct bearing on the present invention. There are also several recent articles and patents in which metal nanoparticles, especially gold, are linked to oligonucleotides for diagnostic applications, but theses documents do not relate to the present invention, either.

EP 00 126 966.1 describes the metallisation of nucleic acids via metal nanoparticles produced ex-situ. This represents an improvement in the state-of-the-art methods cited above, by providing selectivity via the nucleic acid binding group(s) attached to the nanoparticles. Nevertheless, the approach has two shortcomings. One disadvantage is that it requires the synthesis of molecules capable of binding to both nucleic acids and nanoparticles (referred to as "linker molecules").

The "in-situ" approach described in EP 00 125 823.5 circumvents many of these shortcomings, but introduces another. A disadvantage of the in-situ approach is that the density of nanoparticle nucleation sites is limited by the density of metal complexes binding to the nucleic acids in the first step of the procedure. This limitation is magnified by the fact that each particle formed during the second (reduction) step may contain tens of metal atoms. Further, although there is some control over the sites on the nucleic acids where the complexes bind, diffusion of the atoms during the second step makes it difficult to predict the location of the resulting particles.

The techniques of nucleic acid synthesis and modification have been the subject of numerous publications. In particular, these methods are described in the books *Bioorganic Chemistry: Nucleic Acids* (edited by S. M. Hecht, Oxford University Press, 1996) and *Bioconjugate Techniques* (by G. T. Hermanson, Academic Press, 1996). More specifically, the chapter by M. Van Cleve in *Bioorganic Chemistry: Nucleic Acids* (Chapter 3, pages 75–104) describes the techniques of "annealing" and "ligation" for assembling double-stranded nucleic acids from smaller units. The chapter by M. J. O'Donnell and L. W. McLaughlin in the same book (Chapter 8, pages 216–243) and a chapter in *Bioconjugate Techniques* (Chapter 17, pages 639–671) describe procedures for chemical modification of nucleic acids and oligonucleotides and the covalent attachment of reporter groups (fluorophores, spin labels, etc.). These techniques have also been used to attach metal complexes to serve as, for example, redox-active agents and catalysts for bond cleavage, but they have not been used for metallisation purposes.

An example of chemical modification is "bromine activation". Reaction with N-bromosuccinimide, for example, causes bromination at the C-8 position of guanine residues and C-5 of cytosine. Amine nucleophiles can then be coupled to these positions by nucleophilic displacement to introduce various functional groups into nucleic acids. The sites of derivation using this method are not involved in hydrogen bonding during base pairing, so hybridization capabilities are not significantly disturbed.

"Two step" electroless plating processes are known from, for example, U.S. Pat. No. 5,503,877 and U.S. Pat. No. 5,560,960. The substrate to be plated is first exposed to a solution containing metal ion species and then to a solution of a reducing agent that reduces the metal ion species to a metal catalyst. The catalytic metal is usually Pd, but may be also at least one of Pd, Cu, Ag, Au, Ni, Pt, Ru, Rh, Os, and Ir, and is usually combined with an organic ligand containing at least one nitrogen atom. The deposited metal can be magnetic, e.g. Co, Ni, Fe and alloys, which may contain B or P introduced by the reducing agent (e.g. borohydride or hypophosphite, see U.S. Pat. No. 3,986,901; U.S. Pat. No. 4,177,253).

The gold nanoparticles prepared according to the procedure of Duff et al. are structurally related to the phosphine-stabilized $M_{55}$ particles patented by Schmid [U.S. Pat. No. 4,454,070 (1984)], where M is a transition metal including Au, Rh, Ru, Pd, Ni, and Co. They are similarly related to the water-soluble, phosphine-stabilized gold particles patented by Hainfeld et al. [U.S. Pat. No. 5,360,895 (1994) and U.S. Pat. No. 5,521,289 (1996)], where the phosphine is a triphenyphosphine derivative. There are no reports of gold particles prepared according to the procedure of Duff et al. being combined with nucleic acids or using that approach for synthesizing nanoparticles of other metals or metal alloys. However, the latter should be possible, since stable water-soluble complexes of tris(hydroxymethyl) phosphine (THP) with several metals are known (e.g. Ni(0), Pd(0) Pt(0) [Ellis et al. (1992) Inorganic Chemistry, Vol. 31, p. 3026], in addition to Au(I) [Berning et al. (1998) Nuclear Medicine & Biology, Vol. 25, p. 577].

During the synthesis of the particles according to Duff et al., the following reactions are likely to occur.

(1) Neutralization of tetrakis(hydroxymethyl) phophoshphonium chloride (THPC) by sodium hydroxide generates tris(hydroxymethyl)phophine (THP) and formaldehyde:

$P(CH_2OH)_{4+}+OH^- \rightarrow P(CH_2OH_3)+H_2CO+H_2O$ (2a) Reduction of hydrogen tetrachloroaurate(III) by THP in the presence of sodium hydroxide generates metallic gold and the phosphine oxide:

(2) $H[AuCl_4]+3\ P(CH_2OH_3)+8\ OH^- \rightarrow 2\ Au^0+2\ OP(CH_2OH)_3+Cl^-+5\ H_2O$ (2b) The formaldehyde generated in reaction (1) can also serve as the reducing agent:

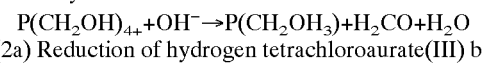

(2c) Reduction of H[AuCl$_4$] by THP can also generate THP-gold(I) complexes, e.g.:
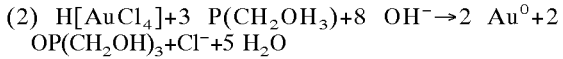
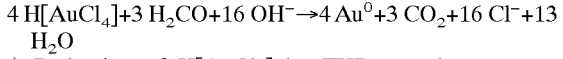
H$_2$O Duff et al. performed an elemental analysis of their dried preparation after dialyzing it to remove by-products and salts and found that it contained 7% P.

Aminomethyl derivatives of tris(hydroxymethyl) phosphine (THP): THP (P(CH$_2$OH)$_3$) is a derivative of phosphine (PH$_3$) and formaldehyde (3×H$_2$CO). As such, it condenses with primary (RNH$_2$) and secondary (R$^1$R$^2$NH) amines in reactions related to Mannich reactions to form aminomethyl phosphine derivatives (GB Pat. 842,593 (1969); Daigle et al. (1974) Journal of Heterocyclic Chemistry, Vol. 11, p. 407; Henderson et al. (1994) Journal of the Chemical Society, Chemical Communications, p. 1863; U.S. Pat. No. 5,948,386 (1999); Berning et al. (1999) Journal of the American Chemical Society, Vol. 121, p. 1658; Krauter and Beller (2000) Tetrahedron, Vol. 56, p. 771). Like THP, complexes of aminomethyl phosphine derivatives form stable water-soluble metal complexes [Joó et al. (1996) Journal of Organometallic Chemistry, Vol. 512, p. 45; Otto et al. (1998) Inorganic Chemistry Communications, Vol. 1, p. 415; Kovács et al. (2000) Comptes Rendus de l'Académie des Sciences—Series IIC—Chemistry, Vol. 3, p. 601]. Thus, it is possible to append DNA binding agents to metal nanoparticles through such modifications. Although the THP-Au particles already exhibit DNA-binding tendencies, appended binding moieties can, for example, be used to strengthen the binding or introduce greater specificity.

Molecules containing multiple OH groups ("polyols") such as sugars bind to DNA [Del Vecchio et al. (1999) International Journal of Biological Macromolecules, Vol. 24, p. 361; Hayashida et al (2001) Chemistry Letters, p. 277], and it has been suggested that the saccharidic residues of some antibiotics and anti-cancer drugs might function as general binding elements for DNA grooves [Nicolaou et al (1992) Journal of the American Chemical Society, Vol. 114, p. 7555]. Hydrogen bonding is probably important for such binding interactions. Certain water-soluble compounds are known to reinforce hydrogen bonding. These compounds are generally known as "kosmotropic" (i.e. structure-forming) agents or "osmolytes" [Arakawa and Timasheff (1985) Biophysical Journal, Vol. 47, p. 411; Galinski et al. (1997) Comprehensive Biochemistry and Physiology, Vol. 117A, p. 357]. Examples of kosmotropic agents are betaine, proline, and dimethylsulfoxide.

OBJECTS AND SUMMARY OF THE INVENTION

Accordingly, the problem underlying the present invention is to provide an improved process for the metallisation of nucleic acids via metal nanoparticles produced ex-situ which may be used, e. g., in the formation of nanowires, for electronic networks and circuits allowing a high density arrangement. A further object of the invention is to provide an improved process for the metallisation of nucleic acids via metal nanoparticles produced ex-situ that can be used for the formation of nucleic acid templated isolated particle chains that can be used for the fabrication of e.g. memory devices based on single electron charging characteristics.

This problem is solved by the inventive process for the metallisation of nucleic acids, in which:
tris(hydroxymethyl)phosphine-Au (THP-Au) particles or derivatives thereof are provided, said particles are bound to a nucleic acid to produce a metal nanoparticle-nucleic acid composite, and in case a nanowire is desired, the metal nanoparticle-nucleic acid composite is treated with an electroless plating solution.

BRIEF DESCRIPTION OF THE DRAWINGS

The invention will now be described in further detail with respect to the accompanying figures in which.

Figure 1:
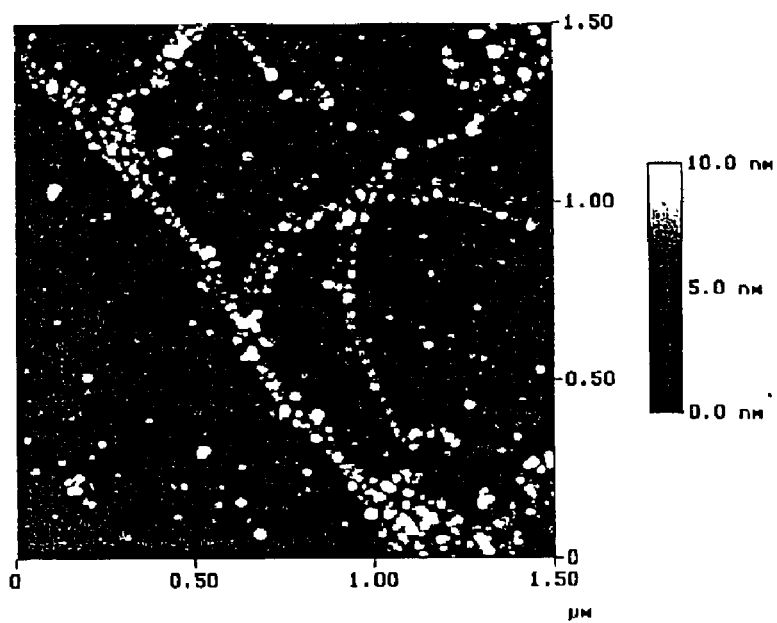
FIG. 1 shows an AFM image of a THP-Au DNA composite produced according to Example 1 before treatment with a solution of GoldEnhance.®

During research work related to the metallisation of nucleic acids, surprisingly we observed (by AFM) very good templating of the THP-Au particles on the nucleic acids when they were incubated together in solution, or when the nucleic acid was exposed to the particles on the substrate. We also found that the templated particles were quite active towards electroless gold and silver plating solutions. We know that the particles are predominantly negatively charged. Since nucleic acids are also negatively charged, the binding mechanism is not a result of electrostatic interactions. Thus, this mechanism is different from the mechanisms described in the prior art for metallisation of nucleic acids.

According to the invention, the binding of said THP-Au particles to the nucleic acid can be performed when the nucleic acid is free in a solution, fixed at one or both of its ends, e.g. to an electrode, immobilized on a substrate or in a semisolid state, e.g. in a gel.

DETAILED DESCRIPTION OF THE DRAWINGS

Furthermore, preferred is a process according to the present invention wherein the binding of said THP-Au particles to the nucleic acids is performed in a solution of water or mixed water-organic solvents.

The nucleic acid for the metallisation can be selected from DNA, RNA, PNA, CNA, oligonucleotides, oligonucleotides of DNA, oligonucleotides of RNA, primers, A-DNA, B-DNA, Z-DNA, polynucleotides of DNA, polynucleotides of RNA, T-junctions of nucleic acids, triplexes and quadruplexes of nucleic acids, domains of non-nucleic acid polymer-nucleic acid block copolymers and combinations thereof. Suitable non-nucleic acid polymers for block copolymers can be polypeptides, polysaccharides, like dextrose or artificial polymers, like polyethylene glycol (PEG) and are generally known to the person skilled in the art. The nucleic acids can be either double-stranded or single-stranded.

In a still further preferred embodiment of the process of the invention, the primary particle size (core diameter) is 0.5–5 nm, preferably 1–3 nm. The concentration of said THP-Au particles during binding to the nucleic acid is 1 $\mu$M–1 mM, preferably 10 $\mu$M–0.1 mM. Binding is performed at a temperature 0–80° C., preferably 20–50° C. The pH of the reaction is 2–10, preferably 4–8. In case that water miscible organic solvents are used, their concentration is (volume %) 0.1–95%, preferably 1–90%. In case that gold (I)-THP complex, [Au(THP)$_x$]$^+$ (where x represents 1, 2, 3, or 4), is used, the concentration is 1 $\mu$M–0.1 M, preferably 0.1 mM–10 mM. In case that salts are used, their concentration is 1 $\mu$M–10 M, preferably 0.1 mM–1 M. Finally, in case that kosmotropic agents are used, their concentrations is 1 mM–10 M, preferably 10 mM–1 M.

In another embodiment of the process according to the invention, the Au of the THP-Au particles can be replaced by another metal selected from the group comprising Fe, Co, Ni, Cu, Ru, Rh, Pd, Ag, Pt, Au or combinations (e.g. alloys) of these metals. Furthermore, the THP of the THP-Au particles can be modified, e.g., with primary (RNH$_2$) and secondary (R$^1$R$^2$NH)amines in reactions related to Mannich reactions to form aminomethyl phosphine derivatives (GB Pat. 842,593 (1969); Daigle et al. (1974) Journal of Heterocyclic Chemistry, Vol. 11, p. 407; Henderson et al. (1994) Journal of the Chemical Society, Chemical Communications, p. 1863; U.S. Pat. No. 5,948,386 (1999); Berning et al. (1999) Journal of the American Chemical Society, Vol. 121, p. 1658; Krauter and Beller (2000) Tetrahedron, Vol. 56, p. 771). The term "derivatives" of the THP-Au particles in the context of the present invention encompasses all these modifications.

In a still further preferred embodiment of the process according to the invention the metal nanoparticles are treated with an electroless plating solution containing a mixture of the metals selected from the group comprising Fe, Co, Ni, Cu, Ru, Rh, Pd, Ag, Pt, Au or combinations (e.g. alloys) of these metals or magnetic and/or magnetized Fe, Co, Ni, or combinations (e.g. alloys) of these metals or combinations (e.g. alloys) of these metals with B or P.

The problem underlying the invention is further solved by a metallised nucleic acid which can be obtained according to one of the inventive methods.

In an even further aspect of the invention, the problem is solved by a linear array of metallic nanoparticles or a nanowire obtainable according to the inventive method. In a still further aspect, the problem is solved by a nanowire which is obtainable by one of the inventive methods. The inventive nanowires can form an electronic network comprising at least one nanowire or an electronic circuit comprising at least one electronic network according to the invention. In addition, the inventive nanowires can be used as electronic components in their not completely metallised form, in which more or less insulating spaces are present between the individual nanoparticles positioned along the nucleic acid strand such that the nanowire is comprised of single conducting islands. These inventive structures can form or can be part of an electronic network or an electronic circuit comprising at least one nanowire. In such electronic networks or electronic circuits, junctions between two or more wires may be formed, wherein each of the wires has a connecting segment proximal to the junction comprising the nanowire. Further, the nanowire comprising networks may be parts of hybrid electronic structures.

The invention is the outcome of our discovery that water-soluble gold nanoparticles, prepared according to a literature procedure, bind spontaneously to nucleic acids. We have also determined that the particles, after binding, can be enlarged by electroless gold or silver plating. Further, the resulting structures were found to be electrically conductive.

The solution proposed by the present invention combines the advantages: (1) it is selective towards nucleic acids and (2) it is simple and versatile.

The metallisation approach described below provides a significant alternative to the those described in the prior art.

Embodiments of the present invention involve three steps: (1) providing TfIP-Au particles (2) binding THP-Au particles to the nucleic acid and (3) treating the particle-nucleic acid composite with an electroless plating solution. Variables include whether step (2) is performed while the nucleic acid is in solution or on a surface, exact proportions of the reagents used during particle synthesis, the particle concentration, the solvent used (water or mixed water-organic), pH, temperature, the nature of the particle counterion, and the presence of additives (salts, organic compounds, etc.) in the particle solution.

The steps are explained in more detail as follows:

Step (1): Synthesis of THP-Au particles

Particle synthesis: The gold nanoparticles that we used were prepared according to a procedure described by Duff et al. (1993) Langmuir, Vol. 9, p. 2310. Accordingly, "reduction of hydrogen tetrachlororaurate(III) by alkaline tetrakis (hydroxymethyl)phosphonium chloride yields a phosphorus-containing gold sol of mean metal-core diameter of 1–2 nm." The authors reported several variations in the exact conditions (e.g., concentration and stoichiometry) and how these affected the particle size. Since then, nanoparticles prepared by this general procedure have been used for coating silica particles with gold [Wescott et al. (1998) Langmuir, Vol. 14, p. 5936] and for preparing supported gold catalysts for low-temperature CO oxidation [Grunwaldt et al. (1999) Journal of Catalysis, Vol. 181, p. 223]. There are no reports of combinations of theses particles with nucleic acids or reports to use this approach for synthesizing nanoparticles of other metals or metal alloys.

Step (2): Binding of THP-Au Particles to the Nucleic Acid

Interactions between DNA and polyols: These interactions are not so well documented as, e.g., intercalation and groove binding, but it is believed that they may be relevant for the present invention, since the THP ligands on the gold nanoparticle surface each has 3 hydroxyl (OH) groups. Since THP is likely to bind to gold through the phosphorous atom, the OH groups are likely to be facing outward. Furthermore, since each gold core is surrounded by a shell of approx. 10–15 THP ligands, the particles are essentially covered with OH groups. Various physical measurements have provided evidences that polyols such as sugars interact with DNA [Del Vecchio et al. (1999) International Journal of Biological Macromolecules, Vol. 24, p. 361; Hayashida, et al. (2001) Chemistry Letters, p. 272], and it has been suggested that the saccharidic residues of some antibiotics and anti-cancer drugs might function as general binding elements for DNA grooves [Nicolaou et al. (1992) Journal of the American Chemical Society, Vol. 114, p. 7555]. The strength of binding can be altered by the presence of additives (salts, kosmotropic agents, etc.) in the particle solution.

Step (3): Treatment of the Particle Nucleic Acid Composite with an Electroless Plating Solution Controlled growth of metal nanoparticles via electroless plating: A number of publications and patents have appeared in the past few years dealing with this topic. Most notable is the work from M. J. Natan's group [e.g. U.S. Pat. No. 6,025,202 (2000) and Brown et al. (2000) Chemistry of Materials, Vol. 12, p. 306]. That work mainly targets the use of metal nanoparticles of controlled size, shape, and density for analytical purposes, especially surface-enhanced Raman scattering (SERS) and electrochemistry.

EXAMPLE 1

Figure 2:
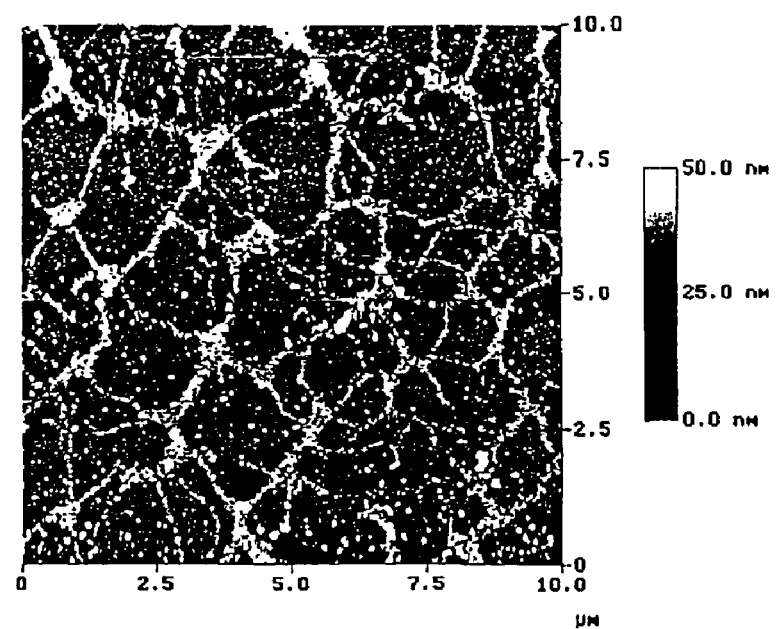
FIG. 2 shows an AFM image of a THP-Au DNA composite produced according to Example 1 after treatment with a solution of GoldEnhance.®
Figure 3:
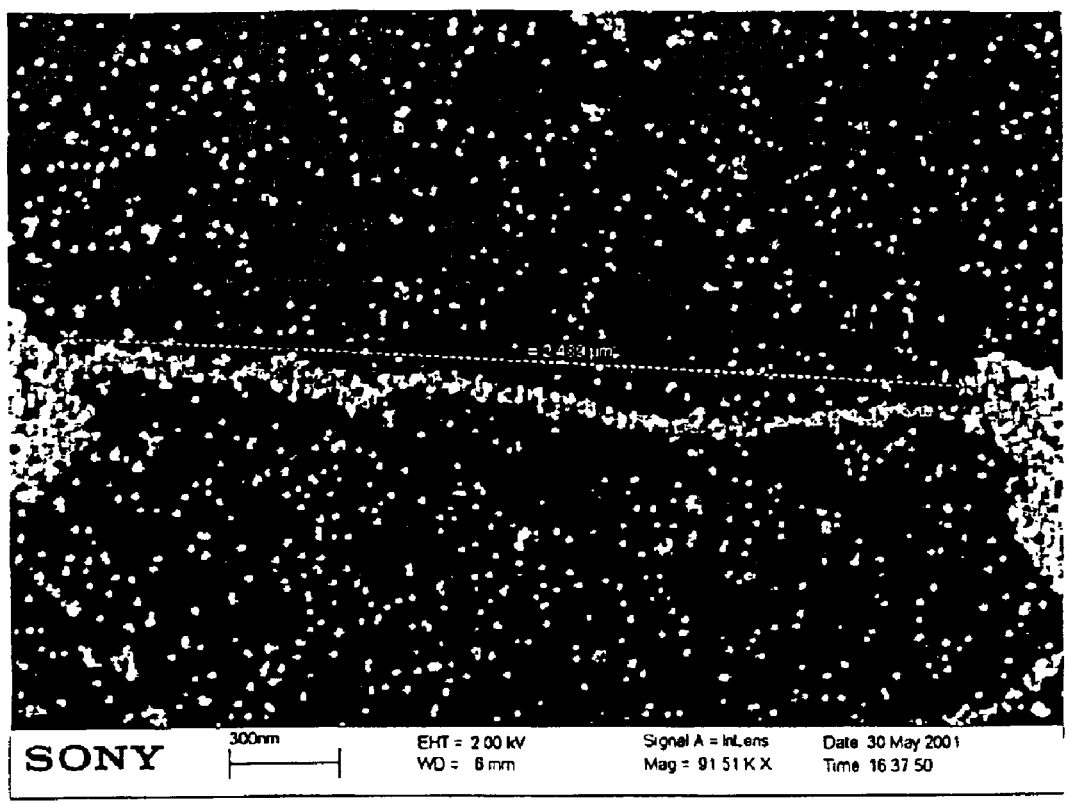
FIG. 3 shows a SEM image of a THP-Au DNA composite produced according to Example 1 after treatment with a solution of GoldEnhance.®

THP-Au particles were synthesised using the larger volume gold solution variation described by Duff et al. (1993). The stock solution of THP-Au was diluted with ca. 9 volumes of ethanol and kept stored a 4° C. This solution was ca. 1 year old when it was used for this experiment. DNA (from calf thymus) was immobilised onto $O_2$-plasma-treated silicon. Then enough of the THP-Au solution to cover the substrate was applied and allowed to evaporate to dryness (ca. 10 minutes). Afterwards, the substrate was rinsed with water and dried. FIG. 1 is an AFM showing ca. 2–5 nm sized particles on the DNA, with much fewer on the silicon substrate. Subsequently, the substrate was treated with freshly prepared GoldEnhance® solution for 5 minutes, then rinsed with water and dried. The AFM image (FIG. 2) shows networks of enlarged particles. The SEM image (FIG. 3) shows an elongated stand of metallised DNA.

EXAMPLE 2

Figure 4:
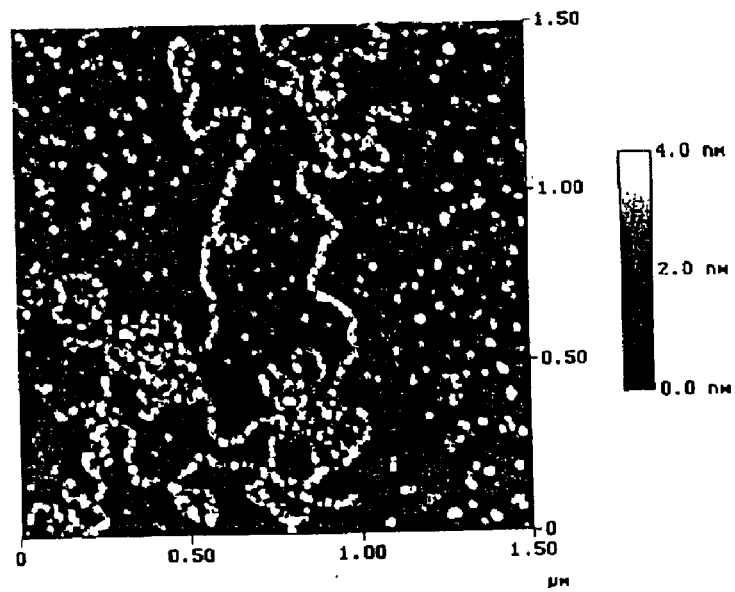
FIG. 4 shows an AFM image of a THP-Au DNA composite produced according to Example 2.

A solution of THP-Au particles from Example 1 was diluted six-fold with a solution containing 70 mg/liter DNA (from calf thymus) and 0.01 M sodium phosphate (pH 7.0). The solution was heated in a water bath at 50° C. for 1 hr, and then kept at 4° C. for 24 hr. This solution was applied to a mica substrate that had been treated with $MgCl_2$. After 1 min, the substrate was rinsed with water and dried. AFM images revealed DNA molecules templated with single particles (FIG. 4).

EXAMPLE 3

Figure 5:
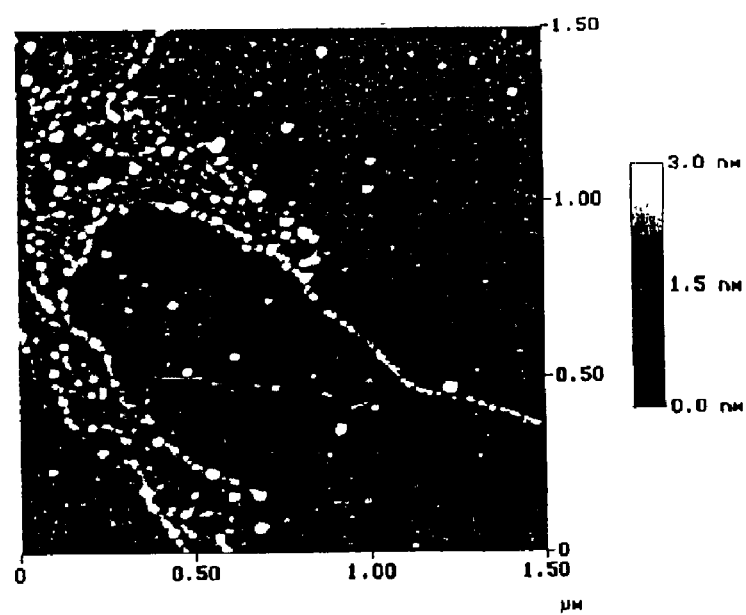
FIG. 5 shows an AFM image of a THP-Au DNA composite produced according to Example 3.

An aqueous solution containing 0.065 M $[Au(THP)_4]Cl$ was prepared by reacting $NaAuCl_4$ with THP in a 1:6 molar ratio [Berning et al (1997) Chemische Berichte/Recueil, Vol. 130, p. 907]. The THP was prepared by reacting THPC with one equivalent of NaOH (equation 1). This solution was diluted with water to give a 1 mM solution of the Au(I) complex. A portion of a one-month old preparation of THP-Au (synthesized using the larger volume gold solution variation described by Duff et all (1993)) was passed through a column of Sephadex® G-50 that had been equilibrated with the 1 mM solution. The solution that eluted from the column contained ca 6 $\mu M$ THP-Au particles and 1 mM $[Au(THP)_4]Cl$. Enough of this solution to cover a silicon substrate with immobilised DNA (prepared as in Example 1) was applied to the substrate and left there for 10 min. Afterwards, the substrate was rinsed with water and dried. AFM images revealed DNA molecules that were mostly covered with 1–3 nm sized THP-Au particles and relatively few on the silicon surface (FIG. 5).

What is claimed is:

1. A process for the metallisation of nucleic acids, comprising providing a sol of tris(hydroxymethyl)phosphine-Au (THP-Au) particles in a solution of water or mixed water-organic solvents;

binding said THP-Au to a nucleic acid to produce a metal nanoparticle-nucleic acid composite by treating the nucleic acid with said sol of THP-Au; and treating the metal nanoparticle-nucleic acid composite with an electroless plating solution.

2. The process according to claim 1, wherein the nucleic acid is immobilized on a substrate prior to the step of binding the THP-Au particles and wherein the step of binding THP-Au particles is performed by treating the nucleic acid with said sot of THP-Au on the substrate.

3. The process according to claim 1, wherein the nucleic acid is selected from the group consisting of DNA, RNA, PNA, CNA, oligonucleotides, oligonucleotides of DNA, oligonucleotides of RNA, primers, A-DNA, B-DNA, Z-DNA, polynucleotides of DNA, polynucleotides of RNA, T-junctions of nucleic acids, triplexes of nucleic acids, quadruplexes of nucleic acids, domains of non-nucleic acid polymer-nucleic acid blockcopolymers and combinations thereof.

4. The process according to claim 1, wherein the nucleic acid is double-stranded or single-stranded.

5. The process according to claim 1, wherein said THP-Au has a core diameter of 0.5–5 nm.

6. The process according to claim 1, wherein said THP-Au are at a concentration of 1 $\mu M$–1 mM.

7. The process according to claim 1, wherein said binding step is performed at a temperature 0–80° C.

8. The process according to claim 1, wherein the reaction is at a pH of 2–10.

9. The process according to claim 1, wherein a water miscible organic solvent additive is used in a concentration 0.1–95% by volume.

10. The process according to claim 1, wherein a gold(I)-complex additive is used in a concentration of 1 µM–0.1 M.

11. The process according to claim 1, wherein a salt additive is used in a concentration of 1 µM–10 M.

12. The process according to claim 1, wherein a kosmotropic additive is used in a concentration of 1 mM–10 M.

13. The process according to claim 1, wherein the metal nanoparticles nucleic acid composite is treated with an electroless plating solution while said composite is dissolved in solution, attached by one or two of its ends, immobilised on a substrate or in a semisolid state.

14. The process according to claim 1, wherein the metal in the core of the nanoparticles is selected from the group consisting of Fe, Co, Ni, Cu, Ru, Rh, Pd, Os, Ir, Ag, Pt, Au or combinations-of these metals.

15. The process according to claim 1, wherein the THP is condensed with a primary or secondary amine.

16. The process according to claim 1, wherein the metal nanoparticles are treated with an electroless plating solution consisting of at least one of the metals selected from the group comprising Fe, Co, Ni, Cu, Ru, Rh, Pd, Os, Ir, Ag, Pt, Au or combinations of these metals.

17. A metallised nucleic acid obtainable according to the process of claim 1.

18. A method for the manufacture of a nanowire, comprising the metallisation of a nucleic acid according to claim 1.

19. A nanowire obtainable according to a process of claim 18.

20. The nanowire according to claim 19 having a structure containing a THP-Au/nucleic acid composite.

21. A small-scale network or electronic circuit, comprising at least one nanowire according to claim 19.

22. The process according to claim 5, wherein said THP-Au has a core diameter of 1–3 nm.

23. The process according to claim 6, wherein said THP-Au are at a concentration of 10 µM–0.1 mM.

24. The process according to claim 7, wherein binding is performed at a temperature of 20–50° C.

25. The process according to claim 8, wherein the pH of the reaction is 4–8.

26. The process according to claim 9, wherein said water miscible organic solvent additive is used in a concentration of 1–90% by volume.

27. The process according to claim 10, wherein said gold(I)-complex additive is used in a concentration of 0.1 mM–10 mM.

28. The process according to claim 11, wherein the salt additive is used in a concentration of 0.1 mM–1 M.

29. The process according to claim 12, wherein the kosmotropic additive is used in a concentration 10 mM–1 M.

30. The process according to claim 13, wherein said semisolid state is a gel.

31. The process according to claim 14, wherein said combinations are alloys.

32. The process according to claim 16, wherein said combinations arc alloys.

* * * * *